United States Patent
Ceballos et al.

(10) Patent No.: US 7,679,540 B2
(45) Date of Patent: Mar. 16, 2010

(54) DOUBLE SAMPLING DAC AND INTEGRATOR

(75) Inventors: Jose Luis Ceballos, Villach (AT); Michael Kropfitsch, Koettmannsdorf (AT)

(73) Assignee: Infineon Technologies AG, Nuebiberg (DE)

( * ) Notice: Subject to any disclaimer, the term of this patent is extended or adjusted under 35 U.S.C. 154(b) by 0 days.

(21) Appl. No.: 11/948,017

(22) Filed: Nov. 30, 2007

(65) Prior Publication Data
US 2009/0140899 A1    Jun. 4, 2009

(51) Int. Cl.
*H03M 1/66* (2006.01)
(52) U.S. Cl. .............. 341/150; 341/118; 341/120; 341/143; 341/172
(58) Field of Classification Search ............ 341/143, 341/144, 118–122, 150, 155, 172
See application file for complete search history.

(56) References Cited

U.S. PATENT DOCUMENTS

| | | | | |
|---|---|---|---|---|
| 5,030,954 A | * | 7/1991 | Ribner | 341/172 |
| 5,323,158 A | * | 6/1994 | Ferguson, Jr. | 341/143 |
| 5,982,315 A | * | 11/1999 | Bazarjani et al. | 341/143 |
| 6,608,575 B2 | * | 8/2003 | Bazarjani | 341/143 |
| 6,674,381 B1 | * | 1/2004 | Gomez et al. | 341/143 |
| 6,748,025 B1 | * | 6/2004 | Hickling | 375/316 |
| 6,954,159 B1 | * | 10/2005 | Cooper et al. | 341/143 |
| 7,023,369 B2 | * | 4/2006 | Bocko et al. | 341/143 |
| 7,190,296 B2 | * | 3/2007 | Gupta | 341/143 |
| 7,280,066 B2 | * | 10/2007 | Pernici et al. | 341/172 |
| 7,423,567 B2 | * | 9/2008 | Melanson | 341/143 |
| 2003/0085825 A1 | * | 5/2003 | Jensen et al. | 341/143 |
| 2005/0231408 A1 | * | 10/2005 | Keaveney et al. | 341/143 |
| 2008/0024342 A1 | * | 1/2008 | Deval et al. | 341/143 |
| 2008/0062024 A1 | * | 3/2008 | Maeda et al. | 341/143 |

* cited by examiner

*Primary Examiner*—Linh V Nguyen
(74) *Attorney, Agent, or Firm*—Lee & Hayes, PLLC

(57) ABSTRACT

This disclosure relates to systems and methods for analog to digital conversion using delta sigma modulation. To this end, the delta sigma modulator includes a double sampling DAC and integrator and a 1-bit comparator, with reference loading insensitivity.

20 Claims, 7 Drawing Sheets

| SWITCHES PHASE | 320 | 322 | 324 | 326 | 328 | 330 |
|---|---|---|---|---|---|---|
| PHASE 1 | 1 | 1 | 0 | 0 | 0 | 0 |
| PHASE 2 | 0 | 0 | 1 | 1 | 1 | 1 |

400

| SWITCHES PHASE | 332 | 334 | 336 | 338 |
|---|---|---|---|---|
| Y | 1 | 0 | 0 | 1 |
| Y' | 0 | 1 | 1 | 0 |

DOUBLE SAMPLING DAC AND INTEGRATOR

BACKGROUND

Electronic circuit components, such as resistors and active filters can be replaced by switched capacitor circuitry. Switched capacitor circuits allow tunable analog circuits to be manufactured with minimal use of resistors. Resistors may be difficult to integrate on silicon substrates, and can make the integrated circuit bulky. The switched capacitor circuits are typically used in order to integrate both analog and digital circuits on a single silicon chip. Switched-capacitor circuits can be used in digital to analog converters (DAC), analog to digital converters (ADC), instrumentation amplifiers, voltage-to-frequency converters, data converters, programmable capacitor arrays, balanced modulators, peak detectors, oscillators, and so on.

Main components of the switched capacitor circuits generally include switches, capacitors, and so on. The switched capacitor circuits employed in various types of ADCs, such as delta sigma ADCs, usually use a large number of capacitors and switches to realize the circuit. Ideally, the capacitance of the capacitors needs to be in a desired ratio, but may deviate from the desired ratio due to reasons, such as imperfections in the manufacturing processes and change of operating conditions (e.g., temperature, voltage, etc.). Such deviations are generally referred to as capacitor mismatch. Due to capacitor mismatches, a delta sigma ADC may not generate an accurate output. This may necessitate minimizing the number of capacitors in the circuit. In addition, switches in switched capacitor circuits may introduce noise in the circuit, and reduce the signal-to-noise ratio of the signal.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

FIG. 4 are exemplary logic tables indicating the state of switches in the FIG. 3.

DETAILED DESCRIPTION

Figure 1:
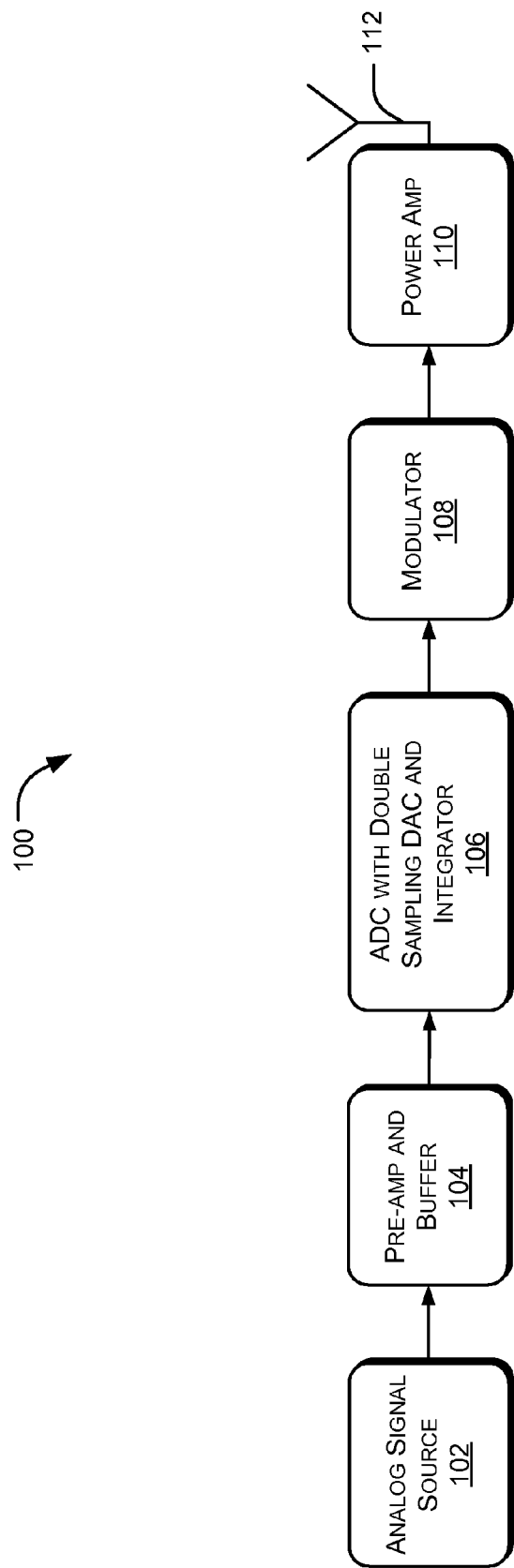
FIG. 1 is a block diagram illustrating an exemplary system for implementing a double sampling DAC and integrator.

This disclosure relates to switched capacitor circuits, and particularly, to a single capacitor doubling sampling digital to analog converter (DAC) with reference loading independence. Reference loading independence is achieved by switching reference(s) to the same loading conditions (e.g., sampling capacitors with similar nominal values), independent from an input signal. The double sampling DAC and integrator circuit can be implemented in a variety of mixed signal circuits including analog to digital converters (ADCs), digital to analog converters (DACs), delta sigma modulators, etc. The following systems and methods are described with reference to a 1-bit delta sigma ADC; however, it is to be appreciated that the disclosed single capacitor double sampling DAC and integrator can be implemented in various other devices.

A delta sigma ADC is specific to a general group of delta sigma converters. A typical delta sigma ADC does not sample a complete input signal, but only the filtered difference between an input signal and a feedback signal. Therefore, fewer bits are required to sample the differences in the amplitudes, and preserving a desired signal to noise ration.

A delta sigma ADC is specific to a general group of delta sigma converters. Typically, delta sigma converters use oversampling. Delta sigma converters can average multiple samples. These delta sigma converters are traditionally used for high-resolution low frequency (e.g., up to 1 MHz) applications, such as speech, audio, precise voltage, and temperature measurements. Delta sigma converters, such as a delta sigma ADC, can include a summing device, an integrator, a comparator, and DAC for converting a feedback signal into an analog signal for the summing device. Typically, these components are realized separately on a semiconductor substrate and require a large number of capacitors and switches to realize the integrated circuit.

The disclosed double sampling DAC and integrator circuit can replace the summing device, the DAC, and the integrator of the delta sigma ADC, thereby, reducing the total number of capacitor and switches required for realizing the delta sigma ADC. As fewer capacitors and switches are employed, the mismatch introduced in the circuitry due to the capacitors is reduced and the noise introduced by the switches is reduced. In addition, since the disclosed double sampling DAC and integrator combines the functionality of the summing device, DAC and integrator in a single circuit, the size of the delta sigma ADC can be reduced, thereby reducing its cost (i.e., manufacturing cost).

The double sampling DAC and integrator circuit can provide a fully differential output signal from a single ended input signal. In an implementation, the input signal can also be a differential signal. The double sampling DAC and integrator includes a plurality of sampling capacitors, switches and a differential operational amplifier. The switches operate in accordance with a clock. The clock can be programmed to a desired sampling frequency. The rising and falling edges of the clock can represent two different phases.

In the first phase, the sampling capacitors can be charged to a voltage associated with the input signal and a feedback signal. In the second phase, the sampling capacitors can be discharged and the output can be fed to the differential operational amplifier.

The disclosed double sampling DAC and integrator can provide an enhancement to a signal-to-flicker noise ratio, where flicker noise may be introduced in circuits due to components like operational amplifiers, capacitors, and so on. Flicker noise can be reduced by increasing the size of the components; however, increasing the size of the components forces the circuit to function slower. Another way to reduce the flicker noise is by increasing input voltage. In an implementation, the double sampling DAC and integrator circuit samples the input signal twice. The sampling is done in phases, for example, a first and a second phase. The ADC thus provides a multiplication factor of two, where the output signal obtained is twice the difference signal. This increases the signal-to-flicker noise ratio.

FIG. 1 illustrates an exemplary system 100 for implementing a double sampling DAC and integrator circuit for switched capacitor circuits implemented through one or more system blocks. The exemplary system 100 can be implemented in a variety of communication systems. For example, system 100 can be implemented in wireless communication systems, mobile communication systems, and so on. The system 100 can be implemented as an apparatus of various apparatuses. The following exemplary system 100 is described with reference to a mobile communication transmission system/device; however, it will be appreciated that the exemplary system 100 can be used in any of the various other devices or systems.

It is to be appreciated that the order in which this block diagram and other block diagrams are described is not intended to be construed as a limitation, and any number of the described system blocks can be combined in any order to implement the system, or an alternate system. Additionally, individual system blocks may be deleted from the system without departing from the spirit and scope of the subject matter described herein. Furthermore, the system can be implemented in any suitable hardware or device without departing from the scope of the invention.

The system 100 can be a mobile communication transmission system, and can transmit voice and data signals. The voice signals are in analog form and can be converted into digital baseband signals using an ADC. The digital baseband signal can then be modulated before transmission. To this end, the exemplary system 100 includes an analog signal source 102, a pre-amplifier and buffer 104, an ADC with double sampling DAC and integrator 106, a digital modulator 108, and a power amplifier 110. The output signal from the power amplifier 110 can then be transmitted via the antenna 112.

The output from the analog signal source 102 can be audio/video signals, data signals, and/or a combination of the two. In an implementation of a voice signal, the source 102 can be a microphone as an example. In an implementation of a video signal, the analog signal source 102 can be a camera as an example.

The output of the analog signal source 102 can be supplied to the pre-amplifier and buffer 104. The pre-amplifier and buffer 104 can amplify low-level analog signals. The preamplifier and buffer 104 may provide some voltage gain but no significant current gain. Analog signals typically undergo attenuation in a circuit and may require amplification before they can be processed further.

In addition, the pre-amplifier and buffer 104 can provide electrical impedance transformation from the analog signal source 102 to the next stage. The pre-amplifier and buffer 104 can aid in transferring the analog signal from the analog signal source 102 having high output impedance to the ADC with double sampling DAC and integrator 106. The pre-amplifier and buffer 104 can prevent the ADC with double sampling DAC and integrator 106 from unacceptably loading the analog signal source 102 and interfering with the sources' desired operation.

The ADC with double sampling DAC and integrator 106 receives the amplified and buffered analog signal. The ADC with double sampling DAC and integrator 106 converts the analog signal to a digital signal.

In an implementation, the ADC with double sampling DAC and integrator 106, hereinafter referred to as ADC 106, can be a delta sigma ADC. The ADC 106 can sample and quantize the analog signal using a 1-bit comparator. It is to be appreciated that the sampling rate of the signal depends on the highest frequency of the analog signal. The sampled and quantized 1-bit signal can then be converted into a multi-bit data stream by employing a digital low pass filter and a decimation circuit. A digital decimation filter can remove quantization noise from the signal.

The modulator 108 receives the multi-bit baseband signal from the ADC 106, and modulates the digital output of the ADC 106. The modulator 108 can up sample the frequency of the signal, for example, by introducing a carrier signal for pass band transmission. In an implementation, if the system 100 is utilized for baseband transmission, digital baseband modulation can be carried out by a baseband modulator. Digital baseband modulation transfers a digital bit stream over an analog low pass channel using a discrete number of signal levels. In another implementation, the modulator 108 can include various signal-processing components, such as digital filters, up samplers, noise shapers, etc.

The power amplifier 110 amplifies and increases the power efficiency of the modulated signal received from the digital modulator 108. In an implementation, such as in a mobile communication system, the power amplifier 110 can be a class C or D non-linear amplifier working in the saturated mode close to the cut-off. In this mode, the non-linear amplifier is usually the most efficient and uses less mobile station battery (i.e., power).

The amplified signal from the power amplifier 110 can be transmitted wirelessly via the antenna 112. In an implementation, the signal from the power amplifier 110 can be passed through a duplexer circuit (not shown). The duplexer circuit can isolate the transmitted signals from the received signal to prevent interference between the received and the transmitted signal.

Figure 2:
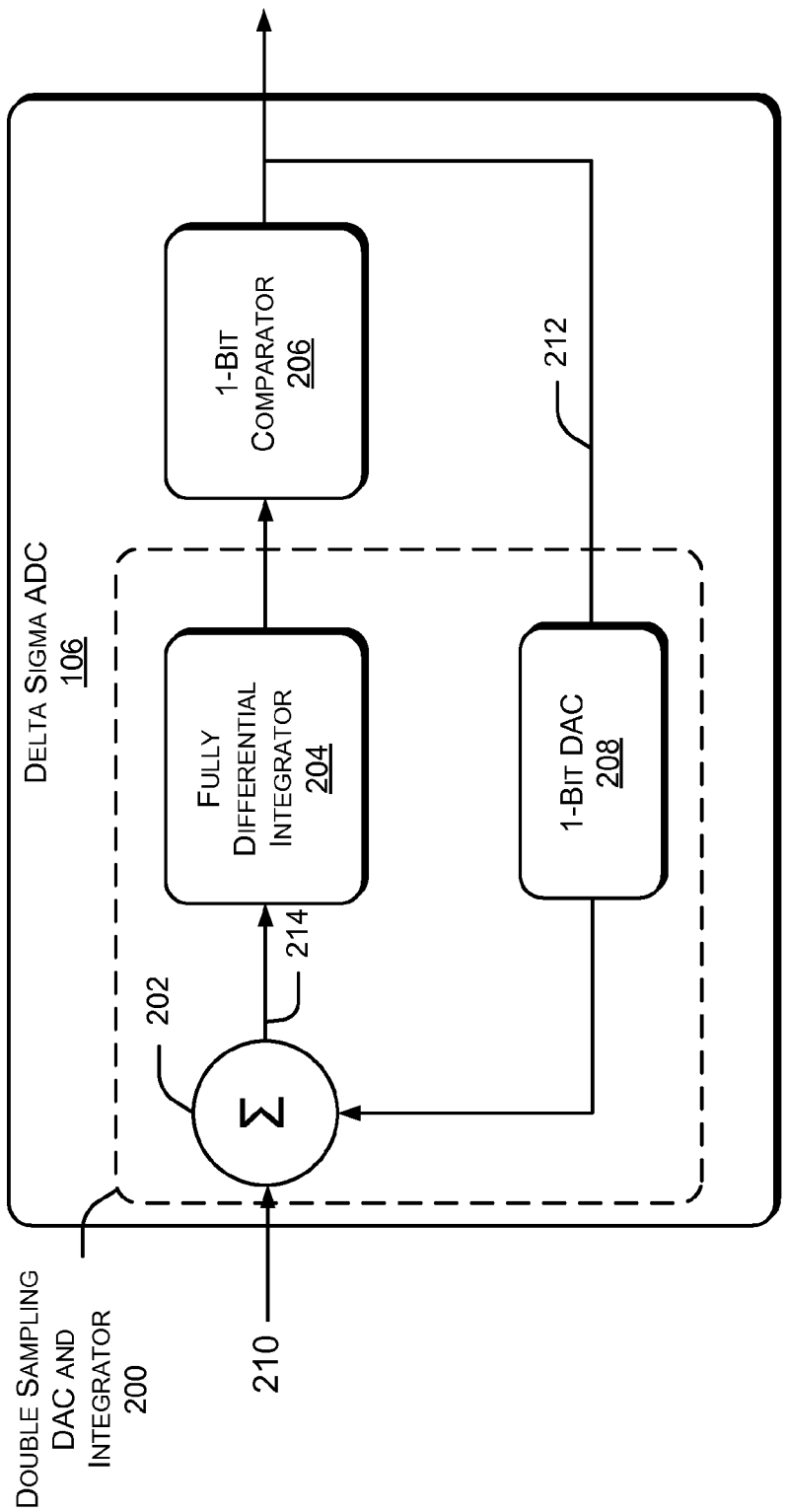
FIG. 2 is a block diagram illustrating an exemplary delta sigma ADC implementing a double sampling DAC and integrator.

FIG. 2 illustrates an exemplary delta sigma ADC 106 implementing a double sampling DAC and integrator 200. To this end, the delta sigma ADC 106 includes a summing device 202, a fully differential integrator 204, and a 1-bit comparator 206 with a feedback loop that includes a 1-bit DAC 208. The double sampling DAC and integrator 200 includes the summing device 202, the fully differential integrator 202 and the 1-bit DAC 208. The double sampling DAC and integrator 200 subtracts the feedback signal 212 from the input signal 210 to obtain a difference signal 214. One of the inputs to the double sampling DAC and integrator 200 can be the input analog signal 210 and the other input can be an analog converted feedback signal 212 from the 1-bit DAC 210.

The input analog signal 210 can be connected to the input of the fully differential integrator 204 of the double sampling DAC and integrator 200. The fully differential integrator 204 generates a fully differential signal integrating its input 214 over time.

In an implementation, the difference signal 214 is fed to the input of the fully differential integrator 204 of the double sampling DAC and integrator 200. The fully differential integrator 204 integrates the difference signal 214. The fully differential integrator 204 can be of any order. In this example, fully differential integrator 204 is of first order, since one integrator is used; however, it is contemplated that higher orders may be implemented. The output signal from the double sampling DAC and integrator 200 is received by the 1-bit comparator 206. A typical comparator is a device that compares two items of data. In this implementation, the comparator compares two input voltages (or currents), and switches its output to indicate which of the two inputs is larger.

In an implementation, one of the input voltages of the 1-bit comparator 206 can be a reference voltage. The signal received from the double sampling DAC and integrator 200 can be compared with the reference voltage, where the reference voltage can be a predefined value. In an implementation, the reference voltage can be ground or zero volts. For example, in one case, the output signal from the comparator 206 can switch from low to high, if the double sampling DAC and integrator 200 output rises above the reference voltage. In another case, the output signal from the comparator 206 can switch from high to low, if the output from the double sampling DAC and integrator 200 drops below the reference voltage or remains unchanged. Thus, the output of the 1-bit comparator 206 is a square wave or 1 bit data stream. The double sampling DAC and integrator 200 and the 1-bit comparator 206 together can convert the input analog signal into a time discrete sampled signal.

Figure 3:
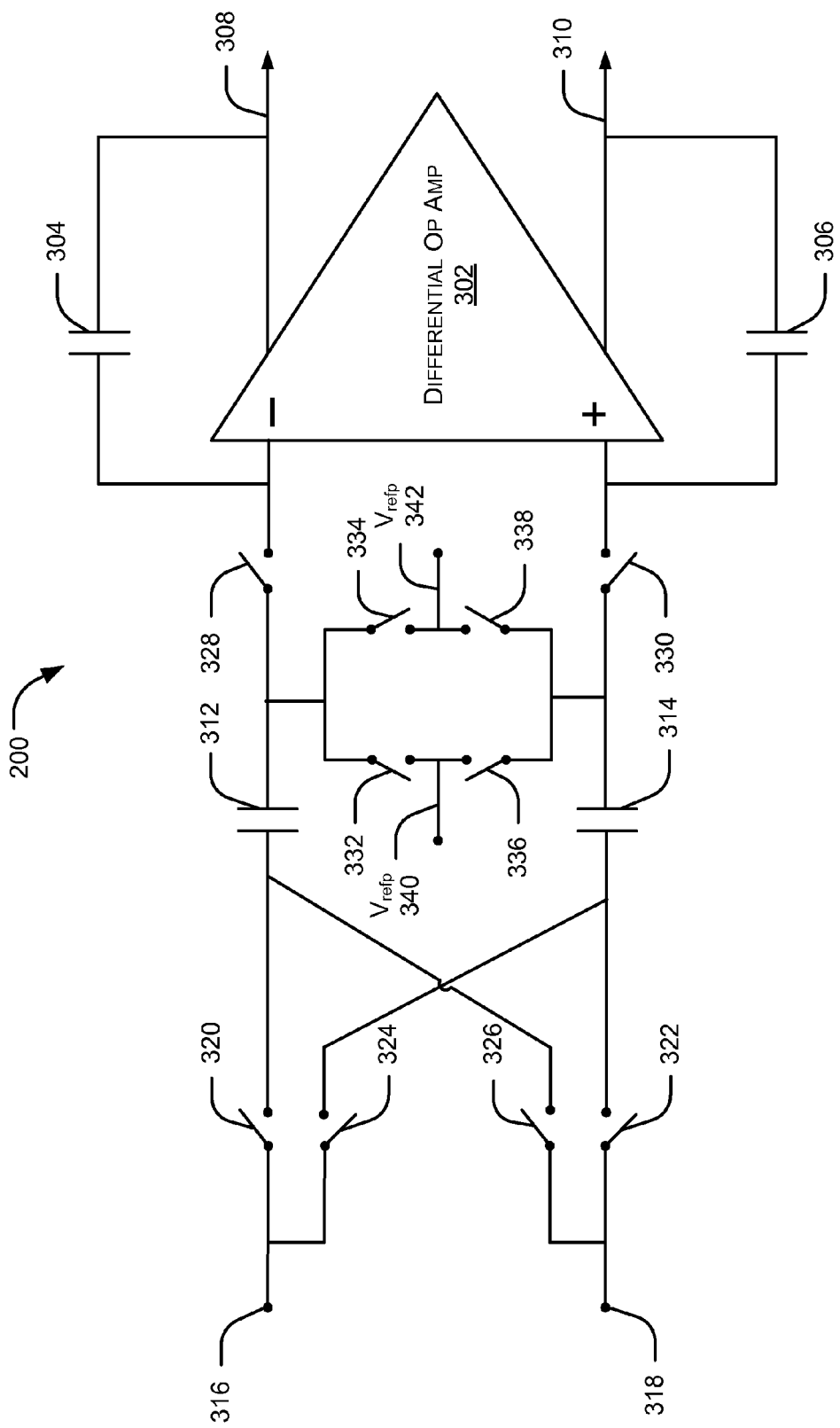
FIG. 3 is a circuit illustrating an exemplary double sampling DAC and integrator.

FIG. 3 illustrates an exemplary circuit diagram of the double sampling DAC and integrator 200. The double sampling DAC and integrator 200 circuit includes a fully differential operational amplifier 302, a plurality of components such as capacitors, switches, and so on. Examples of switches can include high-speed n-type or p-type MOSFET switches, or any other high-speed switches known in the art. The fully differential operation amplifier 302 interchangeably referred to as differential op-amp 302, can act as the fully differential integrator 204. The differential op-amp 302 has a negative and positive input terminal and two integrating capacitors 304 and 306. The integrating capacitor 304 is placed between the negative input and the positive output terminal 308 of the differential op-amp 302. The integrating capacitor 306 is placed between the positive input terminal and the negative output terminal 310 of the differential op-amp 302. In an implementation, the two integrating capacitors can be of the same capacitance.

The double sampling DAC and integrator 200 can further include two or more sampling capacitors such as capacitors 312 and 314, which can be of the same or different capacitance. The sampling capacitor 312 is placed between terminal 316 and the negative input terminal of the differential op-amp 302. The sampling capacitor 314 is placed between terminal 318 and the positive terminal of the differential op-amp 302. The terminals 316 and 318 are capable of inputting analog signal, such as input A or B, respectively. In an implementation, the input signal received at the terminal 316 can be an input analog signal 210 from a source, such as analog signal source 102. In one implementation, the sampling capacitors 312 and 314 can perform sample and hold functions of an input signal. The double sampling DAC and integrator 200 can also include switches 320, 322, 324, 326, 328, 330, 332, 334, 336 and 338. The switches 320, 322, 324, 326, 328, and 330 are operated in accordance with an operating clock, and the output of the operating clock decides the state of the switches. Reference signals $V_{refp}$ 340 and $V_{refn}$ 342 represent a fully differential output.

FIG. 4 illustrates logic tables 400 and 402 indicating the states of the switches 320, 322, 324, 326, 328, 330, 332, 334, 336 and 338. Table 400 illustrates the state of switches 320, 322, 324, 326, 328, and 330, while table 402 illustrates the state of switches 332, 334, 336 and 338. In the tables 400 and 402, a zero ("0") depicts an open or off state for a given switch and a one ("1") depicts a close or on state for a given switch.

Table 400 depicts the state of switches in accordance with the high and the low phases of a clocked signal. During the high phase, such as phase 1, of the clocked signal, switches 320 and 322 are closed while all other switches remain open. During the low phase, such as phase 2, of the clocked signal, switches 324, 326, 328, and 330 are closed, while switches 322 and 324 remain open.

Table 402 depicts the states of the switches 332, 334, 336 and 338. These switches are operational only in phase 1 as they depend on the feedback signal, and the feedback signal is supplied to the circuit in phase 1. It is to be appreciated that the position of these switches depends on the 1-bit feedback signal 212. A high feedback signal 212 can be represented as Y and a low feedback signal 212 can be represented as Y'. From the table 402 it can be observed that a high (one) feedback signal 212 (Y) is associated with the closed state of the switches 332 and 338. Similarly, a low (zero) feedback signal 212 (Y') is indicative of open switches 330 and 332. The operation of the ADC 106 is further described in detail with reference to FIGS. 3, 4, 5 and 6.

Phase 1 (First Phase): Charging of Sampling Capacitors

Figure 5:
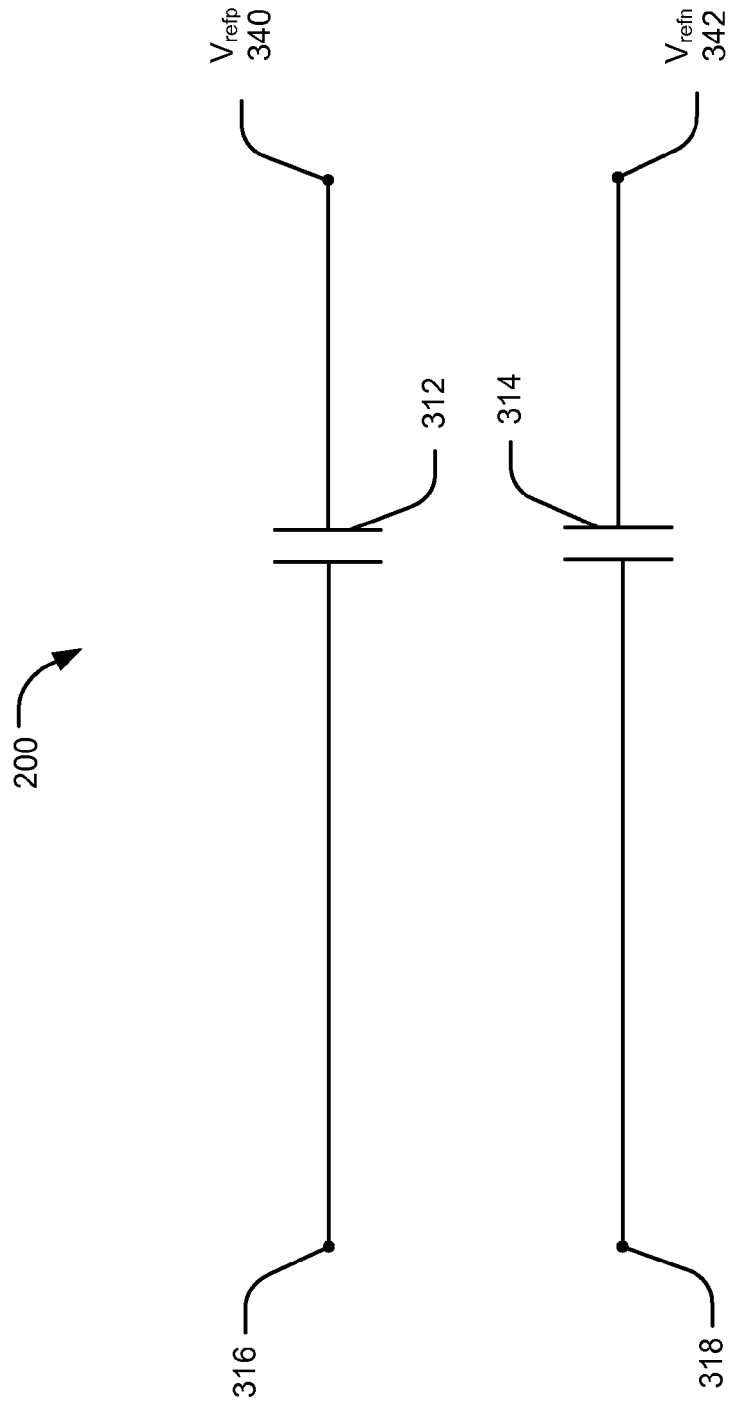
FIG. 5 is a circuit diagram illustrating an exemplary double sampling DAC and integrator in phase 1.

During the first phase, as depicted in the table 400, switches 320 and 322 are in the on state (closed) and switches 324, 326, 328, and 330 are in the off (open) state. Referring now to FIG. 5, this creates a connection between the sampling capacitors (312 and 314) and the terminals (316 and 318), respectively. As discussed above, the terminals 316 and 318 can be connected to an analog signal source 102 supplying input signal 210, such as input A and B respectively.

In an implementation, the input A can be a voltage signal $V_{in}$ sourced from the analog signal source 102. The input signal $V_{in}$ can be represented by the following equation (1):

$$V_{in} = V_{dc} + \Delta V_{in} \quad (1)$$

Where $V_{dc}$ is the reference potential of the input signal, and $\Delta V_{in}$ is the variation of the analog signal around the reference potential $V_{dc}$.

Input B can be a reference potential signal $V_{ref}$ and can be equal to the reference potential $V_{dc}$ as indicated in equation (1). Therefore, the following equation (2) can be representative of $V_{ref}$:

$$V_{ref} = V_{dc} \quad (2)$$

In an implementation, the circuit for double sampling DAC and integrator 200 can include reference signals namely $V_{refp}$ 340 and $V_{refn}$ 342. The reference signals $V_{refp}$ 340 and $V_{refn}$ 342 can represent a fully differential output, such as the output of the 1-bit DAC 208. The output of the 1-bit DAC 208 can be analog signals equivalent to the two levels (i.e., one and zero), associated with a digital signal. In one implementation, $V_{refp}$ 340 and $V_{refn}$ 342 can be represented in the following manner:

$$V_{refp} = V_{ref} + \Delta V \quad (3)$$

$$V_{refn} = V_{ref} - \Delta V \quad (4)$$

$\Delta V$ being the maximum input signal amplitude.

As can be seen from the table 402, the state of the switches depends on the value of the feedback signal 212. Since the feedback signal 212 is a 1-bit signal, the feedback signal 212 can have only one of the two values: namely one (high) or zero (low). Therefore, when feedback signal 212 is one (Y), switches 332 and 338 can be on while switches 334 and 336 can be off. For a zero (Y') valued feedback signal 212, switches 334 and 336 can be on and switches 332 and 338 can be off.

When the feedback signal 212 has a value one (Y), the closed switches 332 and 338, connect the sampling capacitor 312 to $V_{refp}$ 340, and the sampling capacitor 314 to $V_{refn}$ 342 respectively as depicted in FIG. 5. The input signal $V_{in}$ at terminal 316 is connected to the reference signal $V_{refp}$ 342, and the sampling capacitor 312 is charged to a voltage associated with the difference signal 214 obtained by subtracting the voltage values associated with the reference signal $V_{refp}$ 340 from the input signal $V_{in}$. This can be represented by the following equation (5):

$$V_{in} - V_{refp} = V_{dc} + \Delta V_{in} - (V_{dc} + \Delta V) \quad (5)$$
$$= \Delta V_{in} - \Delta V$$

From the above equation (5), it can be determined that the sampling capacitor 312 charges to a voltage $\Delta V_{in} - \Delta V$. The charge associated with the sampling capacitor 312 can be represented as follows:

$$Q_1 = (\Delta V_{in} - \Delta V) * C_{s1} \quad (6)$$

$C_{s1}$ being the capacitance of the sampling capacitor 308, and * denoting a scalar multiplication operation.

Accordingly, the closed switch 338 connects the terminal 318 to the reference signal $V_{refn}$ 342. This charges the sampling capacitor 310 to a voltage value associated with a difference signal 214 obtained by subtracting voltage value associated with the reference signal $V_{refn}$ 342 from the input signal $V_{ref}$. This can be represented by the following equations:

$$V_{ref} - V_{refn} = V_{dc} - (V_{dc} - \Delta V) \quad (7)$$
$$= \Delta V$$

Therefore, for this example, the sampling capacitor 314 charges to a voltage $\Delta V$ and an accumulated charge is represented as:

$$Q_2 = \Delta V * C_{s2} \quad (8)$$

$C_{s2}$ being the capacitance of the sampling capacitor 314, and * denoting a scalar multiplication operation.

As discussed above, the feedback signal 212 is a stream of high and low pulses indicating digital one or zero. It is to be appreciated that the feedback signal 212 can vary in accordance with the previous input signal sample and the state of the present feedback signal 212 can depend on the previous input analog signal 210.

In an implementation, the feedback signal 212 can be equal to zero (Y'). In such a case, the sampling capacitor 312 can be connected to $V_{refn}$ 338 and the terminal 316, while the sampling capacitor 314 can be connected to $V_{refp}$ 340 and the terminal 318.

As a result, the input signal $V_{in}$ at terminal 316 is connected to the reference signal $V_{refn}$ 342 and the sampling capacitor 312 is charged to the voltage associated with the difference signal obtained by subtracting voltage value associated with the reference signal $V_{refn}$ 342 from the input signal $V_{in}$. This may be represented by the following equations:

$$V_{in} - V_{refp} = V_{dc} + \Delta V_{in} - (V_{dc} - \Delta V) \quad (9)$$
$$= \Delta V_{in} + \Delta V$$

Therefore, the sampling capacitor 312 charges to a voltage $\Delta V_{in} + \Delta V$ and the charge accumulated in the sampling capacitor 312 is:

$$Q_1 = (\Delta V_{in} + \Delta V) * C_{s1} \quad (10)$$

Where $C_{s1}$ is the capacitance of the sampling capacitor 312.

The input B at terminal 318 is connected to the reference signal $V_{refp}$ 340 and the sampling capacitor 314 is charged to a voltage associated with the difference signal obtained by subtracting the voltages associated with the reference signal $V_{refp}$ 340 from the input signal $V_{ref}$.

$$V_{ref} - V_{refp} = V_{dc} - (V_{dc} + \Delta V) \quad (11)$$
$$= -\Delta V$$

Therefore, the sampling capacitor 314 charges to a voltage $\Delta V$ and the charge accumulated in the sampling capacitor 314 can be represented as:

$$Q_2 = \Delta V * C_{s2} \quad (12)$$

Where $C_{s2}$ is the capacitance of the sampling capacitor 310.

From equations 9 and 11, it can be determined that the sampling capacitors 312 and 314 can be charged to a value corresponding to a difference voltage 214, which is obtained by subtracting the voltage value associated with the input signal 210 and the feedback signal 212. In an implementation, the difference signal 214 can correspond to a quantization error in systems implementing delta sigma ADCs.

Phase 2 (Second Phase): Discharging of the Sampling Capacitors.

Figure 6:
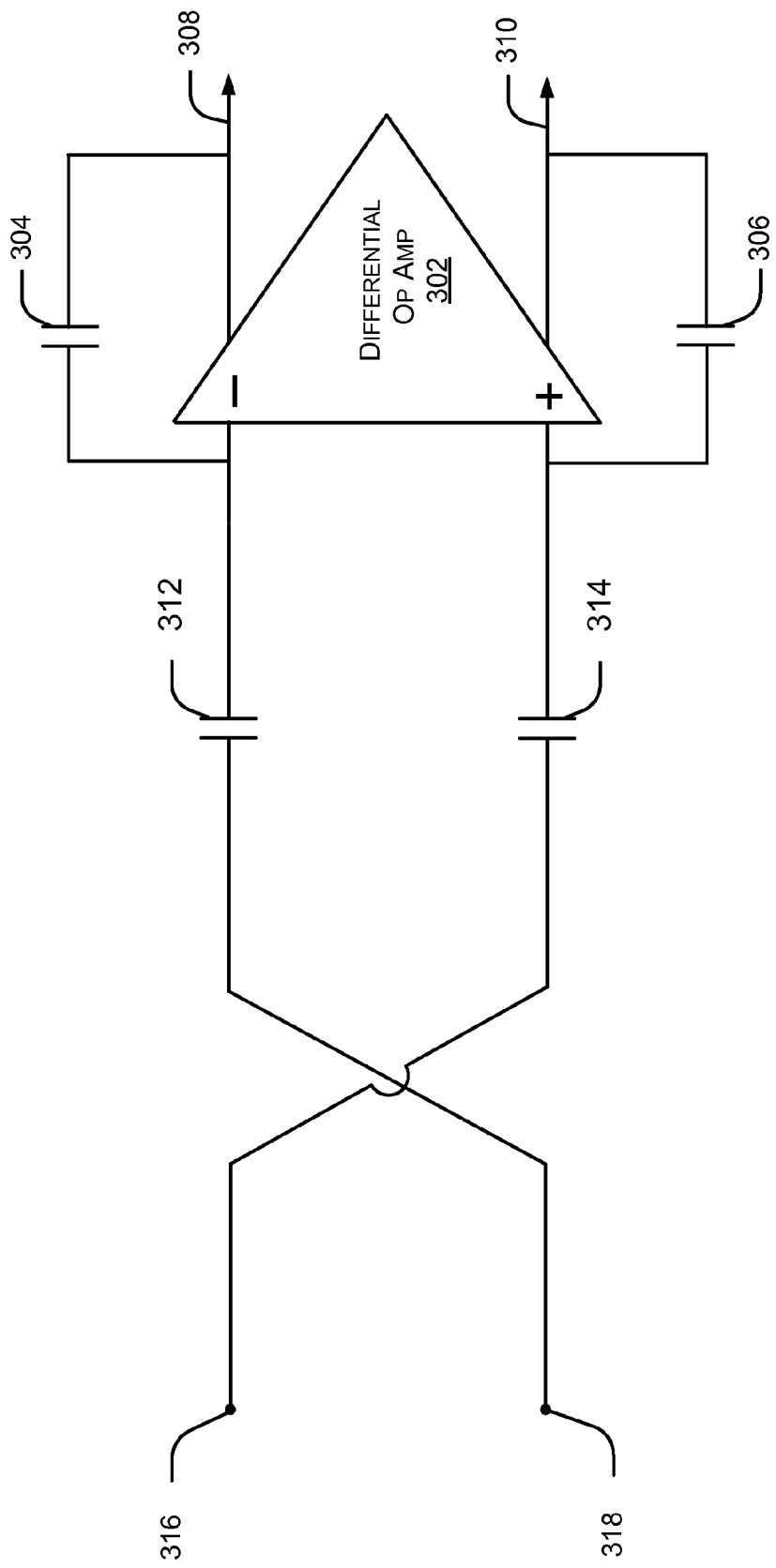
FIG. 6 is a circuit diagram illustrating exemplary double sampling DAC and integrator in phase 2.

FIG. 6 illustrates the exemplary components of double sampling DAC and integrator 200 that are operational during a second phase. As can be seen from table 400, the switches 324, 326, 328, and 330 are in the on (closed) state, while the switches 320 and 322 remain in the off (open) state. As a result, the sampling capacitor 308 is connected to the input terminal 318 and the negative terminal of the differential op-amp 302. Similarly, the sampling capacitor 314 is connected to the input terminal 316 and the positive input terminal of the differential op-amp 302. In the second phase or phase 2, integration of the sampled analog signal is carried out. In an implementation, the difference signal 214 obtained can be integrated. Therefore, the charge stored in the sampling capacitors 312 and 314, is transferred to the differential op-amp 302, where the charge is converted into fully differential voltages. The charge $Q_1$ and $Q_2$ accumulated at the sampling capacitors 312 and 314 is transferred to the integrating capacitors 304 and 306. During the discharging of the sampling capacitors 312 and 316, the charge $Q_1$ (represented by relation 10) accumulated in the sampling capacitor 312 is transferred to the integrating capacitor 304. As a result of this transfer, where the feedback signal 212 is one (i.e., Y), at the beginning of the transfer phase of the voltage $V_A$ at the negative input terminal of the differential op-amp 302 can be represented by:

$$V_A = V_{dc} - (\Delta V_{in} - \Delta V) \quad (13)$$

In case, the feedback signal 212 is zero (Y'), the voltage $V_A$ at the beginning of the transfer phase at the negative input terminal of the differential op-amp 302 can be represented as follows:

$$V_A = V_{dc} - (\Delta V_{in} + \Delta V) \quad (14)$$

Meanwhile, the sampling capacitor 314 is already charged to a potential $\Delta V$ or $-\Delta V$ when the feedback signal 212 is high (1) or low (0) respectively, therefore, the charge is taken from the integrating capacitor 306 and the voltage $V_B$ obtained at beginning of the transfer phase of the positive input terminal of the differential op-amp 302 can be represented by:

$$V_B = V_{dc} + (\Delta V_{in} - \Delta V) \quad (15)$$

Or $$V_B = V_{dc} + (\Delta V_{in} + \Delta V) \quad (16)$$

As a result, a fully differential output represented as $V_{outdiff}$ can be expressed as:

$$V_{outdiff} \propto V_A - (V_B) \propto 2(\Delta V_{in} - \Delta V) \quad (17)$$

Therefore, it can be gathered that the double sampling DAC and integrator 200 samples the input analog signal 210 twice, during phase 1 and phase 2. Therefore, the voltage of the output signal obtained is twice the input analog signal 210 voltage. It is to be appreciated that the effect due to flicker noise introduced in the ADC 106 circuit can be reduced if the input analog signal 210 amplitude is increased. The double sampling DAC and integrator 200 achieves the same result by sampling the signal twice, thereby obtaining an output voltage two times the input analog signal 210. This results in reduced flicker noise in the circuit and a higher signal-to-flicker noise ratio.

Exemplary Method(s)

Figure 7:
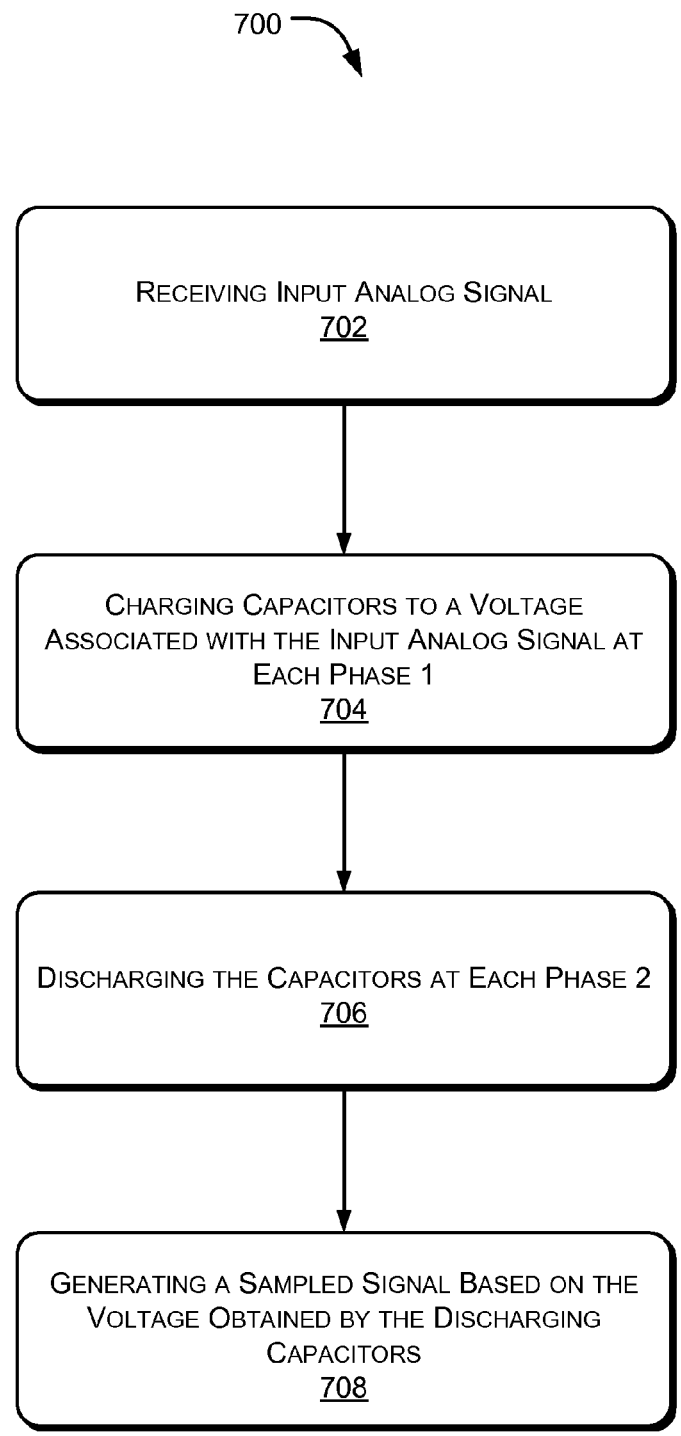
FIG. 7 is a flow chart illustrating an exemplary method for converting analog signals into digital using a double sampling DAC and integrator.

FIG. 7 illustrates an exemplary method 800 to convert an analog signal into a digital signal through sampling and quantizing. The exemplary method 800 can be implemented using a delta sigma ADC with double sampling DAC and integrator. The exemplary method 700 is described with reference to FIGS. 1-6. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein.

At block 702, an analog signal can be received as an input. For example, the double sampling DAC and integrator circuit 200 can receive an input analog signal 210, from a source such as the analog signal source 102. In an implementation, the analog signal 210 can be fed to the double sampling DAC and integrator 200 after amplification and buffering. The analog signal 210 can be a band-limited signal. If the analog signal 210 is not band limited, a low pass filter can be employed before the double sampling DAC and integrator 200 to band limit the analog signal 210.

At block 704, the sampling capacitors can be charged to a voltage value associated with the input analog signal, where such a voltage is a reference voltage. The charging of the sampling capacitors can be performed based on phases of a clocked signal. For example, the sampling capacitors 312 and 314 can be charged to a voltage associated with the input analog signal 210 at a first phase (phase 1). The reference voltage may be based on independent loading (i.e., reference loading independence). Reference loading independence is achieved by switching reference(s) to the same loading conditions. The double sampling DAC and integrator 200 operates in accordance with a clock. It should be appreciated that phase 1 corresponds to high value of the clocked signal. In phase 1, the capacitors 312 and 314 are charged to a voltage associated with a difference signal 214 obtained by subtracting the voltage associated with a feedback signal, such as feedback signal 212, and the input analog signal 210. The input analog signal 210 can be a single-ended signal, which can be inputted to the terminal 312 of the double sampling DAC and integrator 200. The terminal 318 can also receive a DC signal that is at the same reference voltage as the input analog signal 210.

At block 706, the sampling capacitors discharge and in turn charge the integrating capacitors across the differential operational amplifier. For example, during phase 2, the sampling capacitors 312 and 314 are discharged as the switches 328 and 330 are closed. The discharging of the sampling capacitors 312 and 314 charges the integrating capacitors 304 and 306. From the illustrations, such as FIG. 6, it can be gathered that during phase 2, the sampling capacitors 312 and 314 are cross-coupled to the input terminals 316 and 318. This connects the input analog signal 210 at terminal 316 to the sampling capacitor 314 and allows the transfer of charge associated with the sampling capacitors 312 and 314 to the fully differential op-amp 302.

At block 708, a fully differential sampled signal is generated based on the voltage obtained by discharging the capacitors. For example, the input signal 210 is sampled twice, once in phase 1 and once in phase 2 during the cross coupling of the sampling capacitors 312 and 314. The amplitude of the fully differential sampled signal is proportional to twice the amplitude of the input analog signal 210. This sampled signal can be fed to the 1-bit comparator 206 for comparing the signal with a reference value. The comparison results in a two level square wave output, representing a digital high and a low. A part of this signal is fed back to the 1-bit DAC 210 that converts this digital 1-bit stream feedback signal 212 into an analog signal.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as wireless communication devices, computing devices, and other electronic devices.

What is claimed is:

1. An apparatus comprising:
    an analog to digital converter (ADC) that samples and quantizes an analog signal to a digital signal comprised of:
    a doubling sampling digital to analog converter (DAC) and integrator that receives and amplitude multiplies the analog signal using cross-coupled sampling capacitors to reduce flicker noise, wherein the cross-coupled sampling capacitors are charged during a first clock cycle by at least one of a positive and a negative voltage references from a feedback signal, and discharged during a second clock cycle to provide a maximum transfer charge that is proportional to at least twice of analog signal voltage change; and
    a 1-bit comparator that receives an output from the double sampling digital to analog converter (DAC), and generates the digital signal; and
    a modulator that modulates the digital signal.

2. The apparatus of claim 1, wherein the ADC is a delta sigma converter that samples a difference between the analog signal and the feedback signal of the double sampling DAC and integrator.

3. The apparatus of claim 1, wherein the ADC samples the analog signal based on the highest frequency of the analog signal.

4. The apparatus of claim 1, wherein the double sampling DAC and integrator includes a fully differential integrator that generates a fully differential voltage.

5. The apparatus of claim 1, wherein the double sampling DAC and integrator includes a fully differential integrator that receives and integrates a feedback difference signal.

6. The apparatus of claim 1, wherein the double sampling DAC and integrator is implemented on a first order or a higher order loop filter.

7. The apparatus of claim 1, wherein the comparator receives a reference voltage as an input and the reference voltage determines the digital signal.

8. The apparatus of claim 1 further comprising an operational amplifier component that includes an open input switches during the first clock cycle, and a closed input switches during the second clock cycle.

9. A double sampling digital to analog converter (DAC) and integrator comprising:
   an operational amplifier which operates as a fully differential integrator, and receives an analog input signal; wherein the operational amplifier amplitude multiplies the analog input signal using cross-coupled sampling capacitors to reduce flicker noise, wherein the cross-coupled sampling capacitors are charged during a first phase by at least one of a positive and a negative voltage references in a feedback signal, and discharged during a second phase to provide a maximum transfer charge that is proportional to at least twice of analog input signal voltage change;
   two or more sampling capacitors that sample the analog input signal; and
   multiple switches that determine sampling state of the two or more sampling capacitors.

10. The double sampling DAC and integrator of claim 9, wherein the sampling capacitors perform sample and hold of the analog input signal.

11. The double sampling DAC and integrator of claim 9, wherein the sampling capacitors include a cross-coupled connection during the second phase.

12. The double sampling DAC and integrator of claim 9, wherein the multiple switches are operated based on a clock input and feedback signal.

13. The double sampling DAC and integrator of claim 9, wherein the multiple switches are MOSFET switches.

14. The double sampling DAC and integrator of claim 9, wherein the double sampling DAC and integrator outputs one or more reference signals in a feedback loop.

15. The double sampling DAC and integrator of claim 9, wherein the operational amplifier includes an open input switches during the first phase, and a closed input switches during the second phase.

16. A method of converting an analog signal to a digital signal comprising:
   receiving the analog signal;
   charging one or more capacitors to a voltage value associated with the analog signal and reference voltages from a feedback signal;
   discharging the one or more capacitors;
   charging one or more integrating capacitors upon the discharging; and
   generating a fully differential sampled signal that is amplitude multiplied using cross-coupled sampling capacitors to reduce flicker noise, based on the charging of the one or more integrating capacitors.

17. The method of claim 15, wherein the receiving includes a DC reference signal.

18. The method of claim 15, wherein the charging the one or more capacitors is reference loading independent.

19. The method of claim 15, wherein the charging the one or more capacitors is based on phases of a clocked signal.

20. The method of claim 15, wherein the charging the one or more capacitors is based on state conditions connecting the integrating capacitors.

* * * * *

UNITED STATES PATENT AND TRADEMARK OFFICE
CERTIFICATE OF CORRECTION

PATENT NO. : 7,679,540 B2  Page 1 of 1
APPLICATION NO. : 11/948017
DATED : March 16, 2010
INVENTOR(S) : Jose Luis Ceballos and Michael Kropfitsch It is certified that error appears in the above-identified patent and that said Letters Patent is hereby corrected as shown below:

Title Page; item (73); Please correct the spelling of the residence city of the Assignee on the front page of the issued patent to read :

"Neubiberg"

Signed and Sealed this

Fifteenth Day of June, 2010

David J. Kappos
*Director of the United States Patent and Trademark Office*